(12) United States Patent
Knoop

(10) Patent No.: US 8,441,375 B2
(45) Date of Patent: May 14, 2013

(54) AIRCRAFT POWER FAILURE SIMULATION APPARATUS AND METHOD

(75) Inventor: Sven Knoop, Hamburg (DE)

(73) Assignee: Airbus Operations GmbH (DE)

( * ) Notice: Subject to any disclaimer, the term of this patent is extended or adjusted under 35 U.S.C. 154(b) by 414 days.

(21) Appl. No.: 12/745,248

(22) PCT Filed: Nov. 29, 2007

(86) PCT No.: PCT/EP2007/010374
§ 371 (c)(1),
(2), (4) Date: Oct. 19, 2010

(87) PCT Pub. No.: WO2009/068060
PCT Pub. Date: Jun. 4, 2009

(65) Prior Publication Data
US 2011/0205089 A1 Aug. 25, 2011

(51) Int. Cl.
*G08B 21/00* (2006.01)
*F02C 1/06* (2006.01)

(52) U.S. Cl.
USPC .............. 340/945; 340/963; 340/971; 244/58

(58) Field of Classification Search .................. 340/945, 340/952, 963, 971, 12.32; 307/132 M, 149; 361/23, 361/100; 60/39.163, 787, 802; 224/58, 60, 224/62
See application file for complete search history.

(56) References Cited

U.S. PATENT DOCUMENTS

| | | | |
|---|---|---|---|
| 4,251,765 A | 2/1981 | Mears | |
| 4,870,347 A | 9/1989 | Cicerone | |
| 6,459,175 B1 * | 10/2002 | Potega | ........................ 307/149 |
| 6,467,725 B1 | 10/2002 | Coles et al. | |

(Continued)

FOREIGN PATENT DOCUMENTS

| | | |
|---|---|---|
| EP | 1 037 061 | 9/2000 |
| JP | 10090332 A | 4/1998 |

(Continued)

OTHER PUBLICATIONS

Sumio Morioka, "Computer Technology Used in Space Shuttles", Interface, Japan, CQ Publishing Co., Ltd., Aug. 1997, vol. 23, pp. 81-83.

(Continued)

*Primary Examiner* — Van T. Trieu
(74) *Attorney, Agent, or Firm* — Carter DeLuca Farrell & Schmidt LLP

(57) ABSTRACT

A flight management verification apparatus adapted to verify at least one flight management, wherein the flight management in use outputs a warning, disables an aircraft and/or inhibits the activation thereof in response to a power fail condition. The flight management verification apparatus comprises a first connection means adapted to be disposed in a first power indicator line to a first flight management, wherein the first power indicator line provides a signal representative of a condition of a first power supply, and further comprises a first switch connected in use such that the signal of the power indicator line for the first flight management means is switched. Actuating the switch causes the signal on the power indicator line to change indicating a distortion or failure of the power supply of the aircraft and/or a part thereof. The response of the flight management can be verified by the signal output by the flight management, e.g. on a display, or in that the aircraft is deactivated and/or cannot be activated.

10 Claims, 3 Drawing Sheets

U.S. PATENT DOCUMENTS

Figure 1:
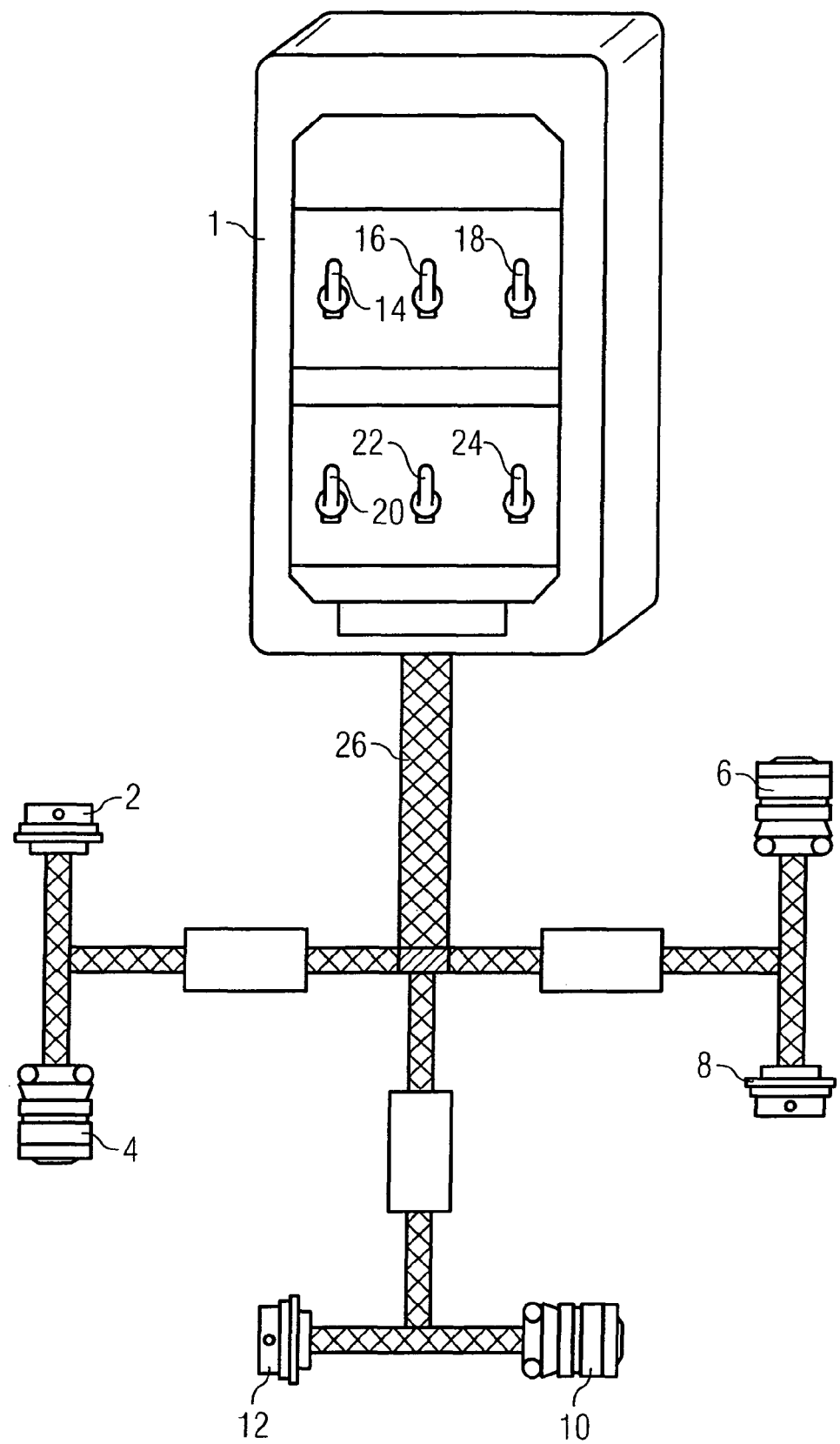

| | | | | |
|---|---|---|---|---|
| 7,002,265 B2 * | 2/2006 | Potega | | 307/149 |
| 7,805,947 B2 * | 10/2010 | Moulebhar | | 60/787 |
| 2003/0085621 A1 * | 5/2003 | Potega | | 307/18 |
| 2010/0300117 A1 * | 12/2010 | Moulebhar | | 60/801 |

FOREIGN PATENT DOCUMENTS

| | | |
|---|---|---|
| RU | 2089032 C1 | 8/1997 |
| RU | 25817 U1 | 10/2002 |
| RU | 2279141 C1 | 6/2006 |

OTHER PUBLICATIONS

Japanese Office Action for corresponding application No. 2010-535225 dated Jul. 3, 2012.

International Search Report for Appln. No. PCT/EP2007/010374 dated Aug. 11, 2008.

Decision on Granting for corresponding Russian Patent Application No. 2010123912/28, dated Nov. 11, 2011.

* cited by examiner

AIRCRAFT POWER FAILURE SIMULATION APPARATUS AND METHOD

The present invention relates to an apparatus and a method for simulating a power failure in an aircraft. In response to such power failure a warning has to be displayed, devices of the aircraft have to be deactivated automatically or manually in response to a warning, and/or their activation has to be inhibited automatically.

During normal flight operation two generators each assigned to one aircraft engine generate electric power for aircraft control means and passenger comfort means, wherein such power supply is redundant for safety reasons. In case of a failure of one generator the other generator supplies the complete aircraft system with power, but without providing redundancy. A warning is displayed and some electric devices in the aircraft can be switched off. Particularly, upon failure of the generator of one engine certain systems of the aircraft have to be switched off automatically and/or must be prevented from being switched on, such as an entertainment system of an aircraft. Switching off such systems ensures flight safety, since the failure of the generator of one engine reduces the power available and switching off certain systems reduces overall electric power consumption. Particularly, the aircraft is assigned to category 3, if a redundant power supply is provided. Category 3 permits automatic approach and landing. If one generator fails, there is no redundant power supply and accordingly the aircraft is downgraded into category 2. Category 2 indicates the pilot that upon a further failure in a system of the aircraft, the pilot is obliged to fly the aircraft manually. The pilot is not allowed to use the autopilot for automatic landing for safety reasons, if the aircraft is assigned to category 2, thus the pilot has to switch off the autopilot for landing and is not allowed to switch it on. In case of a failure of both generators, an auxiliary power supply, such as an extendable external turbine, supplies the aircraft with emergency power, wherein a warning is displayed and electric devices not necessary during emergency operation can be switched off automatically.

During tests on the ground a failure of the first generator driven by the first engine or the second generator driven by the second engine, and a failure of both generators activating an emergency power supply have to be simulated in order to verify that certain aircraft systems, such as the entertainment system and galleys, are deactivated and/or cannot be activated, in response to the power failure. Further, a warning has to be displayed to the pilot in order to indicate the pilot that certain systems, such as an autopilot, should and/or must not be used.

It is an object of the present invention to provide an easy to operate simulation of a power failure of a generator driven by an engine for the purposes of testing.

The object of the present invention is achieved by a method for verifying at least one flight management means and the wiring connected thereto, wherein the flight management means is adapted to output a warning, disable an aircraft means and/or inhibiting the activation thereof, in response to a power condition of at least one power supply in an aircraft. The method comprises the following steps. A switch means is disposed in a power indicator line connected to a first flight management means, wherein the power indicator line provides a signal indicative of a power supply condition. The signal on the power indicator line is modified by actuating the switch means. The response of the flight management means is verified.

The flight management means can be a so-called flight management and guidance computer or a so-called flight guidance computer. The flight management means can control at least one aircraft means. The aircraft means can be any device in the aircraft independent whether such device needs electric power or not, such as the aircraft entertainment system, air-conditioning, galley or the like. The switch means can be disposed in a power indicator line using an adapter connector. Actuating the switch means causes the signal on the power indicator line to change indicating, i.e. simulating, a distortion or failure of the power supply to the flight management system or another component of the aircraft. The response of the flight management means can be verified by the signals output by the flight management means, e.g. on a display, or in that the aircraft means is deactivated and/or cannot be activated. In the alternative, the signals emitted by the flight management means can be measured. The power indicator lines do not transmit power to any device in the aircraft. Rather, the power indicator lines transmit a signal indicative of a power condition of a power supply. During operation, the flight management system is provided with a redundant power supply, thus it cannot detect a power failure without external information. The term wiring can include a cable harness and a bus bar as well as parts thereof.

It is an advantage of the present invention that testing of other components of the aircraft can continue when the reaction of the flight management means to a power failure is tested. Conventional test methods switched off a power supply and tested the response of the flight management means. The inventive method for testing the response of the flight management means to a power failure only modifies a signal on a power indicator line, and does not disable the power supply resulting in that tests of further components of the aircraft can continue independent of the test of the response of the flight management means to a power failure.

The signal of the power indicator line can be indicative of a redundant power supply from a plurality of power supplies. If an aircraft comprises a plurality of power supplies, the signal on the power indicator line can indicate that a redundant power supply is provided for a plurality of flight management means. If such redundant power supply is provided for a plurality of flight management means, the aircraft is assigned to category 3, permitting automatic landing.

The signal on the power indicator line can be transmitted to a plurality of flight management means.

The step of modifying the signal on the power indicator lines can include the steps of simulating an interruption of a power supply, such as a voltage breakdown, a short circuit or an overload condition. The step of disposing a switch means in a power indicator line can include disposing a switch means in a plurality of power indicator lines and/or disposing a plurality of switch means in a plurality of power indicator lines connected to a plurality of flight management means, and the step of modifying the signal on the power indicator line includes the step of modifying a plurality of signals on a plurality of power indicator lines. Thereby, the correct wiring of a complex aircraft cable harness and operation of a flight management means can be tested by performing simple and error proof steps.

The object of the present invention is also achieved by a flight management means operation verificator adapted to verify at least one flight management means and the wiring connected thereto, wherein the flight management means in use outputs a warning, disables an aircraft means and/or inhibits the activation thereof in response to a power (supply) fail condition. The flight management means operation verificator comprises a first connection means adapted to be disposed in a first power indicator line to a first flight management means, wherein the first power indicator line provides a signal indicative of a condition of the first power supply, and further comprises a first switch means connected in use such that the signal of the first power indicator line coupled with the first flight management means is switched.

As mentioned before, the flight management means can be a so-called flight management and guidance computer or flight guidance computer. The flight management means can control at least one aircraft means. The aircraft means can be any device in the aircraft independent whether such device needs electric power or not, such as the aircraft entertainment system, air-conditioning, galley or the like. The connection means can be an adapter connector that can be connected to a suitable connector of the aircraft cable harness and/or to a connector of an aircraft device.

Actuating the switch means causes the signal on the power indicator line to change indicating a distortion or failure of the power supply of the aircraft and/or a part thereof. The response of the flight management means can be verified by the signal output by the flight management means, e.g. on a display, or in that the aircraft means is deactivated and/or cannot be activated.

The flight management means operation verificator can comprise a second switch means connected in use such that the signal of a second power indicator line coupled with a second flight management means is switched. The second flight management means can be a flight management means redundant to the first flight management means being a prerequisite to aircraft operation in category 3, such as automatic approach and landing.

The flight management means operation verificator can further comprise a second connection means adapted to be disposed in a third and fourth power indicator line to a first and second flight management means, respectively, wherein the third and fourth power indicator lines provide a signal indicative of a condition of a second power supply, a third switch means connected in use such that the signal of the third power indicator line coupled with the first flight management means is switched, and a fourth switch means connected in use such that the signal of the fourth power indicator line coupled with the second flight management means is switched. The signal indicative of a condition of the first and/or second power supply, can indicate a condition of the power supply, such as normal operation, low voltage, a power failure, an overload condition or the like. During normal operation, the second power supply provides power to the second flight management means, resulting in a redundant power supply for the second flight management means, wherein such redundant power supply for the second flight management means is necessary for flight operation in category 3, as mentioned before.

With the flight management means operation verificator the safety systems of an aircraft providing the redundant power supply can be verified. The two power supplies and two flight management means of the aircraft provide a double redundancy resulting in a very complex harness and a very complex control means for an associated bus bar. However, the flight management means operation verificator of the present invention is adapted to verify such complex cable harness, the assembly thereof in the aircraft, an associated bus bar and/or a control of the bus bar.

The flight management means operation verificator can further comprise a third connection means adapted to be disposed between a fifth and sixth power indicator line to the first and second flight management means, respectively, wherein the fifth and sixth power indicator line provide a signal indicative of a condition of a third power supply, a fifth switch means connected in use such that the signal of the fifth power indicator line coupled with the first flight management means is switched, and a sixth switch means connected in use such that the signal of the sixth power indicator line coupled with the second flight management means is switched. The first power supply can be a first generator driven by a first aircraft engine, the second power supply can be a second generator driven by a second aircraft engine, and the third power supply can be an emergency power supply for an aircraft, such as a battery or an extendable auxiliary turbine, which is activated and extended, respectively, in case of a failure of both generators. The term power supply can also comprise the bus bar and a part thereof.

When a power failure of both the first and second power supply occurs, the flight management means can disable an aircraft comfort system, such as an air conditioning, an aircraft entertainment system or the like, in order to save battery power of the aircraft battery. Further a warning has to be displayed, as mentioned before.

The person skilled in the art appreciates that a cable harness and an associated bus bar supporting such complex redundancies and fallback strategies is complex by design. However, as mentioned before, the flight management means operation verificator is capable of verifying such a complex cable harness and power bus bar. The flight management means operation verificator is easy to operate and therefore an operating error is very unlikely to occur.

The above mentioned apparatus can be used for verifying the flight management means, the cable harness and/or the bus bar. The flight management means operation verificator can be a power fail simulator apparatus and can be used to simulate any power fail condition in an aircraft.

Figure 2:
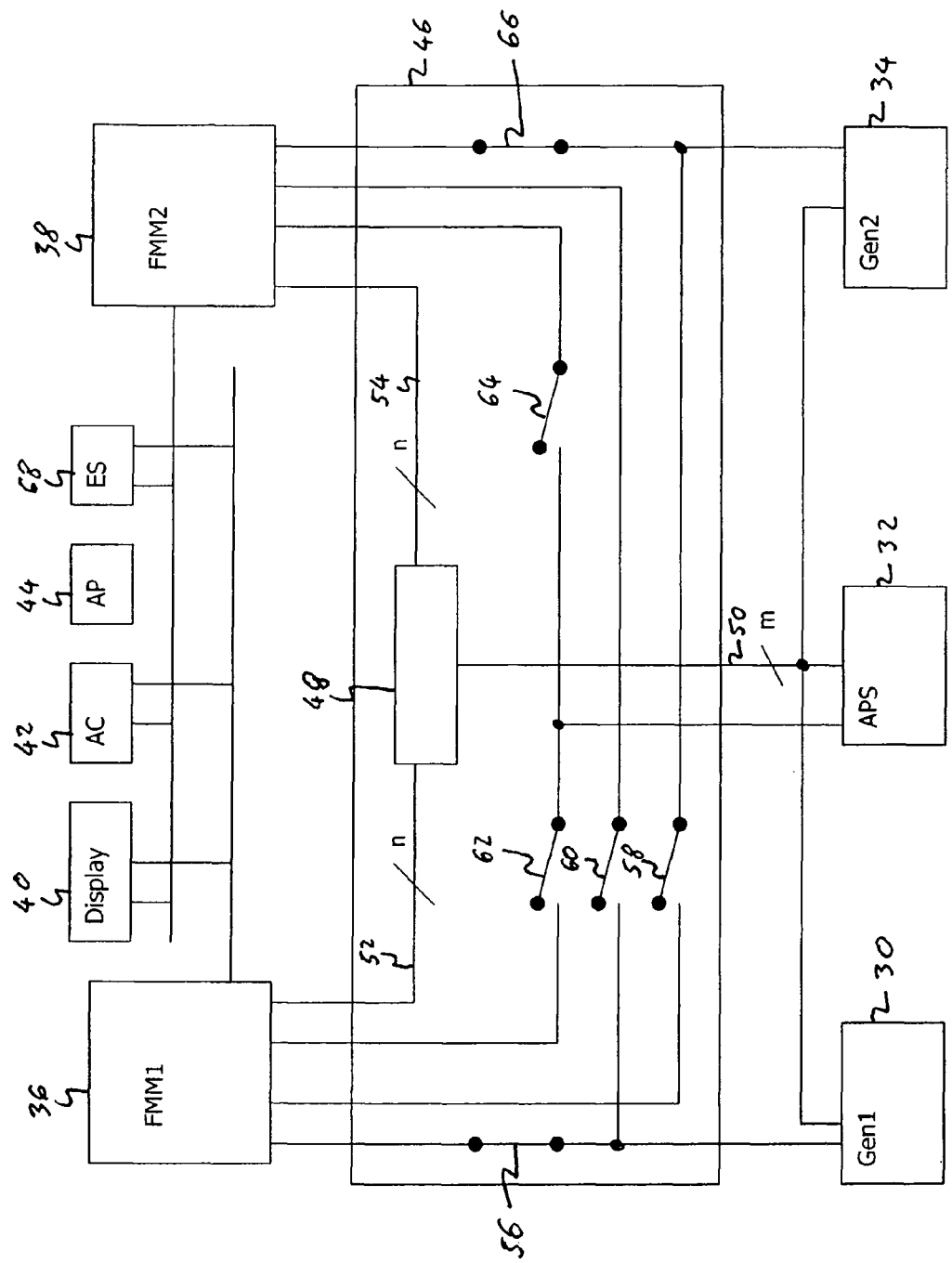
Figure 3:
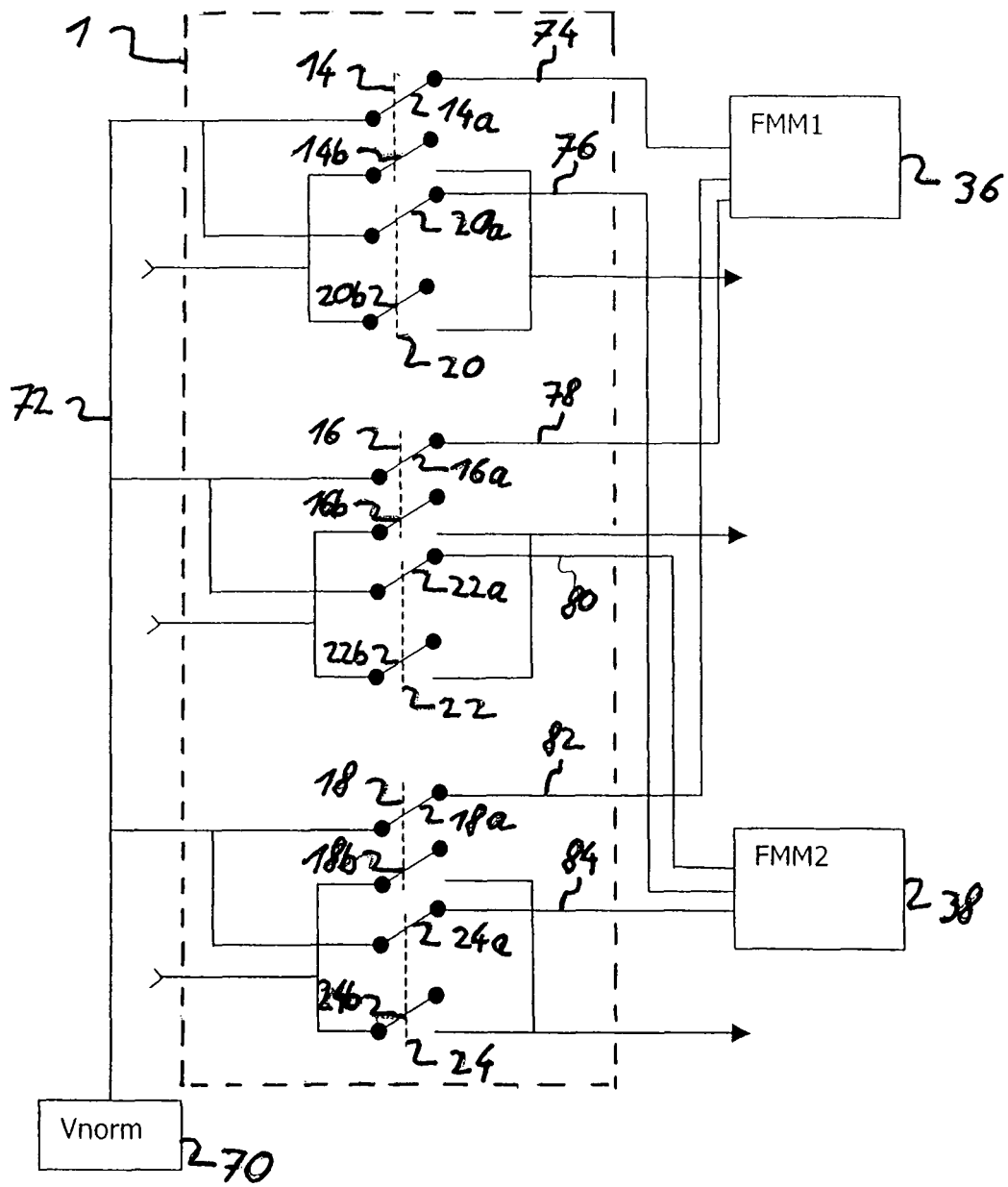

The invention will now be described more detailed with reference to the appending figures, wherein FIG. 1 is a pictorial view of a flight management means operation verificator according to the present invention;

FIG. 2 is an exemplary schematic of a redundant power supply of two flight management means in an aircraft; and FIG. 3 is a schematic of the flight management means operation verificator of the present invention.

FIG. 1 shows a flight management means operation verificator 1 comprising six switches 14, 16, 18, 20, 22, 24. A first connection means comprises a male connector 2 and a female connector 4, a second connection means comprises a male connector 8 and a female connector 6, and a third connection means comprises a male connector 12 and a female connector 10. The flight management means operation verificator 1 further comprises a cable 26 for connecting the plurality of connectors and switches.

Reference is made to FIG. 2. An aircraft comprises a first generator 30, a second generator 34 and an emergency current source 32, which can be a battery or an extendable, external turbine. A first flight management means 36 and/or a second flight management means 38 display messages on a display 40 and can optionally control an air-conditioning 42 and an entertainment system 68. A power bus bar 46 distributes the power from a first generator 30, the emergency power supply 32 and the second generator 34 to the first flight management means 36 and/or the second flight management means 38, depending on the condition of the power supplies 30, 32, 34. The bus bar control 48 senses via a plurality of lines 50 the operation conditions of the first generator 30, the emergency power supply 32 and the second generator 34. The bus bar control 48 transmits signals on a plurality of power indicator lines 52, 54 to the first flight management means 36 and second flight management means 38, respectively.

During normal flight operation the first generator 30 supplies the first flight management means 36 with power, and similarly the second generator 34 supplies the second flight management means 38 with power. If a power failure is detected by the bus bar control 48 in the first generator 30, the bus bar control 48 opens switch 56 and closes switch 58 such that the second generator 34 supplies the first flight management means 36 and the second flight management means 38 with power. However, in such case no redundant power supply is provided for the first and the second flight management means 36, 38 and the aircraft is downgraded from category 3 to category 2. In category 2 automatic landing is not permitted, and moreover for safety reasons certain devices, such as the entertainment system 68 have to be switched off. Accordingly the flight management means 36, 38 displays a warning on the display 40 and can optionally switch off the entertainment system 68 and/or inhibit that the entertainment system 68 can be activated.

Upon detection of a different power failure, the bus bar control 46 can switch the further switches 60, 62, 64, 66 in the bus bar in the second generator 34 and/or the emergency power supply 32 in a similar manner as the switches 56 and 58, as discussed before, in order to provide power to the first and second flight management means 36, 38 without redundancy and can signal the type of power failure via a plurality of power indicator lines 52 to the first flight management means 36 and via a second plurality of power indictor lines 54 to the second flight management means 38. However, FIG. 2 is only a simplified schematic for the purposes of explaining the invention. The cable harness, bus bar and bus bar control in an aircraft is very complex and distributed over the aircraft, thus testing and verifying the correct overall function is a complex task.

FIG. 3 is a schematic of a flight management means operation verificator 1 when connected to a first flight management means 36 and a second flight management means 38, e.g. via a bus bar, cable harness or the like, during test mode. For the ease of explanation, the bus bar 46 and the cable harness of the aircraft are not shown in FIG. 3. As mentioned before, the flight management means operation verificator 1 comprises switches 14, 20, 16, 22, 18, 24. Each switch comprises a primary switch means indicated by the letter "a" and a secondary switch means indicated by the letter "b", wherein both switch means are switched simultaneously upon actuation of the respective switch.

For simulating normal operation, the first switch means 14a, the second switch means 20a, the third switch means 18a, the fourth switch means 24a, the fifth switch means 16a and the sixth switch means 22a are closed in order to apply signal Vnorm to the first flight management means 36 and the second flight management means 38 signalling that the above-mentioned redundant power supply from the first power supply 30 and the second power supply 34 is available. No warning message will be outputted by the first and second flight management means 36, 38. Vnorm is usually the ground voltage and indicates that no power fail condition is to be signalized. Upon actuation of the switch 14, the first switch means 14a is opened and no signal Vnorm is applied to the first power indicator line 74 and accordingly an abnormal power condition is signalled to the first flight management means 36. The first flight management means 36 will display a warning, disable an aircraft means, such as an entertainment system 68, and/or will inhibit the activation thereof. Upon actuation of the second switch 20, the second switch means 20a is opened and no signal Vnorm is applied on the second power indicator line 76 resulting in an abnormal power condition signalled to the second flight management means 38. The second flight management means 38 will also display a warning, disable an aircraft means and/or inhibit the activation thereof.

Upon actuation of the third switch 18, the third switch means 18a is opened and accordingly no signal Vnorn is applied to the third power indicator line 82 and consequently an abnormal power condition is signalled to the first flight management means 38 resulting in the above-mentioned response of the first flight management means 36. If the fourth switch 24 is actuated, the fourth switch means 24a is opened and no signal Vnorm is signalled on the fourth power indicator line 84 to the second flight management means 38, leading to the above-mentioned response of the second flight management means 38.

Upon actuation of the fifth switch 16, the fifth switch means 16a is opened and consequently no signal Vnorm is applied to the fifth power indicator line 78 indicating an abnormal power condition to the first flight management means 36 resulting in the above-mentioned response of the first flight management means 36. Upon actuation of the sixth switch 22 the sixth switch means 22a is opened and accordingly no signal Vnorm is applied to the sixth power indicator line 80. Accordingly, an abnormal power condition is signalled to the second flight management means 38, which will respond as mentioned before thereto.

The first switch 14 and the second switch 20 simulate an error in a first generator driven by a first engine. The third switch 18 and the fourth switch 24 simulate an error in a second generator driven by a second engine. The fifth switch 16 and the sixth switch 22 simulate that an emergency power supply, such as a battery or an extendable auxiliary supply, is activated. The first flight management means 36 and second flight management means 38 have a plurality of power indicator lines 74, 78, 82 and 76, 80, 84, respectively, connected thereto. However, the person skilled in the art appreciates that signals indicating a plurality of error conditions can be transmitted on a single power indicator line.

In normal flight operation, the function of the first and second switches 14 and 20 is accomplished by a first relay, the function of the third and fourth switches 18 and 24 is accomplished by a second relay and the function of the fifth and sixth switches 16 and 22 is accomplished by a third relay. If a power fail condition occurs during normal flight operation, the first, second and third relays will be energized in order to signal a power fail condition to the first and second flight management means 36, 38. Thus, if just one of the signal indicator lines 74, 76, 78, 80, 82, 84 would not apply Vnorm to either the first flight management means 36 or the second flight management means 38, a message would be displayed on the display 40 and an aircraft device, such as the entertainment system 68, would be switched off. Testing such complex design having multiple redundancies is a complex and error prone task.

If a simulated power error signal would be fed during testing into the system at the generator side the first, second and third relays would be energized and due to the multiple redundancies no testing would be possible at all.

Moreover, if the first relay is switched during test mode, a power fail signal is transmitted to the first and second flight management means 36, 38 via the first power indicator line 74 and the second power indicator line 76. Both flight management systems 36, 38 will display a warning and disable an aircraft device. Due to the redundant layout, an error on first power indicator line 74 and/or an error of the first flight management means 36 would not be detected, since the second power indicator line 76 would not apply Vnorm to the second flight management means 38 and thus the second flight management means 38 would display a warning on the display 40 and/or deactivate the entertainment system 68. Vnorm is usually the ground voltage. If the first power indicator line 74 is inadvertently connected to ground, the first power indicator line 74 could not signal a power fail condition to the first flight management means 36.

Without the device and method of the present invention the multilevel redundancy of the present invention could only be verified by a continuity check line by line and applying signals indicative of a power fail condition directly to the first and second flight management means 36, 38.

Further switch means 14b, 20b, 16b, 22b, 18b and 24b can be used for further test and display purposes. These further switch means 14b, 20b, 16b, 22b, 18b and 24b are connected to a device displaying in the cockpit of the aircraft a simplified schematic of the actual power supply condition currently available. The simplified schematic of the actual power supply condition includes the actual condition of the generators 30, 34, the bus bar and the cable harness. This simplified schematic is available for the pilot and the testing personal.

The inventive flight management means operation verificator 1 is easy to connect to a bus bar and/or cable harness in a commercial large cabin aircraft, since it comprises only few connectors. Further, a complicated power distribution scheme comprising multiple redundancies can be tested with the easy-to-use flight management means verificator. An operating error is unlikely to occur, since the inventive flight management means operation verificator 1 comprises only six switches. No power supply is deactivated during the above-mentioned test, thus other tests of the aircraft are not interrupted.

The invention claimed is:

1. A method for verifying at least one flight management means and the wiring connected thereto, the method comprising the steps of:
   disposing a switch means in a power indicator line connected to a first flight management means, wherein the power indicator line provides a signal indicative of a condition of a power supply;
   modifying the signal on the power indicator line by actuating the switch means; and
   verifying the response of the flight management means;
   wherein the step of disposing a switch means in a power indicator line includes disposing a switch means in a plurality of power indicator lines and/or a plurality of switch means in a plurality of power indicator lines connected to a plurality of flight management means, and the step of modifying the signal in the power indicator line includes the step of modifying a plurality of signals in a plurality of power indicator lines; and
   wherein the flight management means is adapted to output a warning, disable an aircraft means and/or inhibit the activation thereof, in response to a power condition of at least one power supply in an aircraft.

2. The method according to claim 1, wherein the signal in the power indicator line is indicative of a redundant power supply from a plurality from power supplies.

3. The method according to claim 1, wherein the signal in the power indicator line is transmitted to a plurality of flight management means.

4. The method according to claim 1, wherein the step of modifying the signal in the power indicator line includes the step of simulating an interruption or an overload condition of a power supply.

5. A flight management means operation verificator comprising:
   a first connection means adapted to be disposed in a first power indicator line connected to a first flight management means, wherein the first power indicator line provides a signal indicative of a condition of a first power supply;
   a first switch means connected in use such that the signal of the first power indicator line coupled with the first flight management means is switched;
   a second switch means connected in use such that the signal of a second power indicator line coupled with a second flight management means is switched; and
   wherein the flight management means operation verificator is adapted to verify at least one flight management means and the wiring connected thereto, wherein the flight management means in use outputs a warning, disables an aircraft means and/or inhibits the activation thereof, in response to a power fail condition.

6. The flight management means operation verificator according to claim 5, further comprising
   a second connection means adapted to be disposed in a third and fourth power indicator line to a first and second flight management means, respectively, wherein the third and fourth power indicator line provide a signal indicative of a condition of a second power supply;
   a third switch means connected in use such that the signal of the third power indicator line coupled with the first flight management means is switched; and
   a fourth switch means connected in use such that the signal of the fourth power indicator line coupled with the second flight management means is switched.

7. The flight management means operation verificator according to claim 6, further comprising
   a third connection means adapted to be disposed between a fifth and sixth power indicator line to the first and second flight management means respectively, wherein the fifth and sixth power indicator line provides a signal indicative of a condition of a third power supply;
   a fifth switch means connected in use such that the signal of the fifth power indicator line coupled with the first flight management means is switched; and
   a sixth switch means connected in use such that the signal of the sixth power indicator line coupled with the second flight management means is switched.

8. The flight management means operation verificator according to claim 7, wherein the third power supply is an emergency power supply for an aircraft.

9. The flight management means operation verificator according to claim 6, wherein the second power supply is a second generator driven by a second aircraft engine.

10. The flight management means operation verificator according to claim 5, wherein the first power supply is a first generator driven by a first aircraft engine.

* * * * *